(12) United States Patent
Noji et al.

(10) Patent No.: US 6,278,128 B1
(45) Date of Patent: Aug. 21, 2001

(54) SEMICONDUCTOR DEVICE HAVING EXTERNAL CONNECTION TERMINALS FORMED IN TWO-DIMENSIONAL AREA

(75) Inventors: Hiroyuki Noji, Chigasaki; Koichi Fukuda, Yokohama, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/363,033

(22) Filed: Jul. 29, 1999

(30) Foreign Application Priority Data

Jul. 30, 1998 (JP) .................................................. 10-215633

(51) Int. Cl.[7] .................................................. H01L 23/58
(52) U.S. Cl. ............................ 257/48; 257/758; 257/738; 257/778
(58) Field of Search ....................................... 257/48, 758

(56) References Cited

U.S. PATENT DOCUMENTS 6,100,117 * 8/2000 Hao et al. ............................. 438/132
6,109,530 * 8/2000 Larson et al. ......................... 235/492

FOREIGN PATENT DOCUMENTS 2-256258 * 10/1990 (JP) ........................................ 257/48
3937504A1 * 10/1990 (DE) ..................................... 257/758

* cited by examiner

*Primary Examiner*—Eddie Lee
*Assistant Examiner*—Lourdes Cruz
(74) *Attorney, Agent, or Firm*—Banner & Witcoff, Ltd.

(57) ABSTRACT

A first bonding pad is formed on the surface of a semiconductor chip on which a semiconductor circuit is formed. A first insulating substrate is formed on the semiconductor chip, and a wiring layer is formed on the first insulating substrate. A second insulating substrate is formed on the first insulating substrate and wiring layer. A first region is formed by forming an opening in the second insulating substrate to expose part of the surface of the wiring layer. The first region and first bonding pad are connected by a wire. A second region is formed by forming an opening in the second insulating substrate to expose part of the surface of the wiring layer. In the second region, a bump is formed. Further, a third region is formed by forming an opening in the second insulating substrate to expose part of the surface of the wiring layer. The third region has at least an area necessary for the terminal of a measurement device to contact the third region in operation measurement.

30 Claims, 8 Drawing Sheets

| FUSE0 | FUSE1 | SEL1 | bSEL1 | SEL2 | bSEL2 | SEL3 | bSEL3 | SEL4 | bSEL4 |
|---|---|---|---|---|---|---|---|---|---|
| L | L | H | L | L | H | L | H | L | H |
| H | H | L | H | H | L | L | H | L | H |
| H | L | L | H | L | H | H | L | L | H |
| L | H | L | H | L | H | L | H | H | L |

SEMICONDUCTOR DEVICE HAVING EXTERNAL CONNECTION TERMINALS FORMED IN TWO-DIMENSIONAL AREA

BACKGROUND OF THE INVENTION

The present invention relates to a semiconductor device which has an outer shape almost equal in size to a semiconductor chip on which a semiconductor circuit is formed, and has external connection terminals formed in a two-dimensional area.

In recent years, to enhance system performance, demands are arising for a large capacity and high speed in the logic scale of a semiconductor device and the like. Along with this, a larger number of pins and excellent electrical characteristics (load characteristics) are demanded for a package for packaging a semiconductor chip (to be referred to as a chip) on which a semiconductor circuit is formed.

In conventional packages such as an SOP and QFP, the pads of a chip are wire-bonded to a lead frame, and the shape of the lead frame determines electrical characteristics. Since the lead frame must be long to a certain degree, its inductance is difficult to reduce.

To realize a larger number of package pins and excellent electrical characteristics, a package which has an outer shape almost equal in size to a chip and can be mounted on an external printed board by bumps (balls) formed in a two-dimensional area without using any wire bonding has been developed.

Figure 1A:
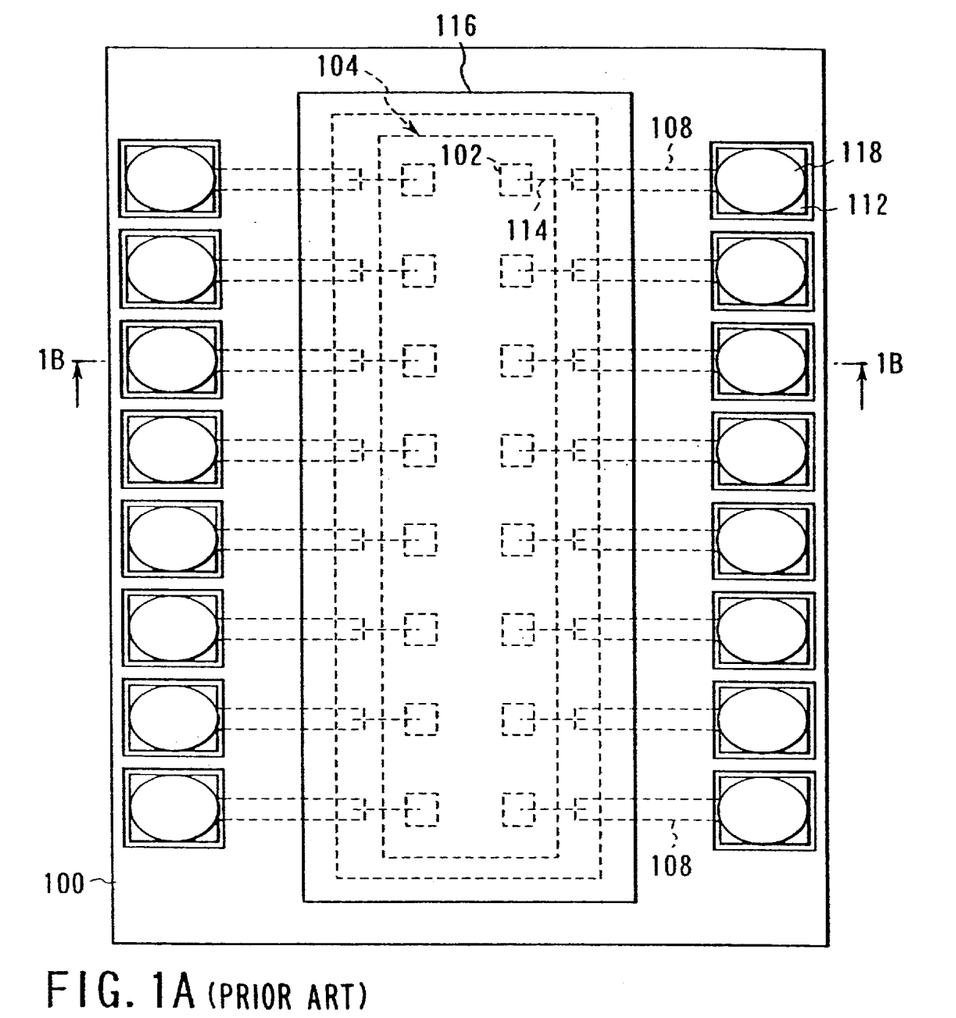
FIG. 1A is a plan view showing a conventional package.
Figure 1B:
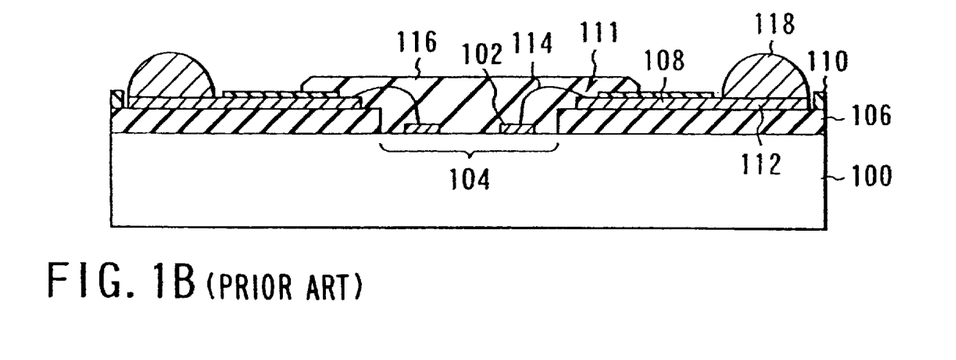
FIG. 1B is a sectional view showing the package in FIG. 1A taken along the line 1B—1B.

FIG. 1A is a plan view showing a conventional package, and FIG. 1B is a sectional view showing the package in FIG. 1A taken along the line 1B—1B. The package shown in FIGS. 1A and 1B is a center pad device in which pads are arranged near the center of a chip, and has the following arrangement.

As shown in FIGS. 1A and 1B, pads 102 are arranged near the center of a chip 100 on which a semiconductor circuit is formed. An organic substrate 106 called an interposer having an opening 104 for exposing the pads 102 is formed on the chip 100. A wiring pattern 108 like the one shown in FIGS. 1A and 1B is formed on the organic substrate 106. An organic substrate 110 is formed on the wiring pattern 108. The organic substrate 110 has an opening so as to expose the opening 104, bonding regions 111 on the wiring pattern 108, and bump formation regions 112 on the wiring pattern 108. The organic substrates 106 and 110 are made of a polyimide film.

Wires 114 for connecting the pads 102 and bonding regions 111 are bonded between them. An insulating film 116, e.g., a molded resin for covering and protecting the wires 114 and their bonded portions is formed in the opening 104. Bumps 118 are formed in the bump formation regions 112 of the wiring pattern 108.

The package having the arrangement as shown in FIGS. 1A and 1B can shorten the distance from each pad 102 of the chip 100 to the corresponding bump 118 serving as an external connection terminal. Hence, this package is lower in inductance between the pad and external connection terminal than a conventional package using a lead frame between the pad and external connection terminal. Thus, this package can cope with high-speed operation. Since the bumps 118 can be arranged in a matrix, the number of pins can be easily increased.

Screening of non-defectives and measurement of various characteristics for the package having the arrangement as shown in FIGS. 1A and 1B will be described. Screening and measurement for this package are done by the following method.

In general, the package is measured after being set in an auxiliary socket called a test carrier in order not to degrade the reliability of the bump 118. In this case, however, the measurement results are affected by the characteristics of the package itself owing to the presence of inductance at a portion connected to the signal line of the test carrier.

When measured characteristics are important, characteristics are measured by bringing the bump 118 of the package into contact with the exposed portion of an impedance-matched wiring pattern on the test board. This measurement can obtain almost accurate characteristics of the package itself because the connected portions except for the bump 118 of the package are impedance-matched. However, the bump 118 is pressed against the wiring pattern, so a contact scratch may be formed on the bump 118 to affect package reliability.

To avoid this, as a method of measuring original package characteristics without forming any contact scratch on the bump 118, the characteristics are measured by connecting the bump of a membrane probe card to a bump formation pad before finally forming the bump 118 on the package. The membrane probe card is constituted by forming a wiring layer and ground potential layer in a organic substrate so as to face each other in order to maintain impedance matching of the wiring layer, and forming a connection bump on the wiring layer. In this membrane probe card, the impedance is not matched at only the bump. However, since the bump is as short as several ten $\mu$m, the impedance is substantially matched, and original package characteristics can be measured. Further, this measurement method can substantially measure original package characteristics as far as the bump length on the package is almost equal to the bump length on the membrane probe card.

However, when characteristics are measured by bringing the bump of the membrane probe card into contact with the bump formation region 112 before forming the bump 118 on the package, a contact scratch is formed in the bump formation region 112. A contaminant generated upon contact, such as cutting dust or the like generated when the contact scratch is formed, attaches to the bump formation region 112. The attached contaminant deteriorates tight contact between the bump formation region 112 and bump 118, resulting in low package reliability.

BRIEF SUMMARY OF THE INVENTION

The present invention has been made to solve the above problems, and has as its object to provide a semiconductor device capable of measuring the device characteristics of a package without damaging a region where an external connection bump is to be formed, or degrading package reliability. The semiconductor device has an outer shape almost equal in size to a chip, and has external connection terminals formed in a two-dimensional area.

To achieve the above object, according to the first aspect of the present invention, there is provided a semiconductor device comprising a semiconductor chip on which a semiconductor circuit is formed, a first bonding pad formed on a surface of the semiconductor chip, a first insulating substrate formed on the semiconductor chip, a wiring layer formed on the first insulating substrate, a wire for electrically connecting the wiring layer and the first bonding pad, a second insulating substrate formed on the wiring layer, a first region where an opening is formed in the second insulating substrate to expose part of a surface of the wiring layer, and a second region where an opening is formed in the second insulating substrate to expose part of the surface of the wiring layer, the second region allowing contact of a terminal of a measurement device in operation measurement. In the semiconductor device having this arrangement, the terminal of a measurement device is connected in operation measurement not to the first region where an external connection bump is to be formed, but to the second region as the inspection region. Thus, the first region is not damaged. Package reliability is not degraded by, e.g., deterioration of tight contact between the first region and bump.

To achieve the above object, according to the second aspect of the present invention, there is provided a semiconductor device comprising, a semiconductor chip on which a semiconductor circuit is formed, a first bonding pad formed on a surface of the semiconductor chip, a first insulating substrate formed on the semiconductor chip, a wiring layer formed on the first insulating substrate, a wire for electrically connecting the wiring layer and the first bonding pad, a second insulating substrate formed on the wiring layer, and a region where an opening is formed in the second insulating substrate to expose part of a surface of the wiring layer, the region having a first region where a bump is formed, and a second region where no bump is formed, the second region allowing contact of a terminal of a measurement device in operation measurement.

In the semiconductor device having this arrangement, the terminal of the measurement device is connected in operation measurement to the second region for inspection where no external connection bump in the region is formed. Accordingly, the first region where the bump is formed is not damaged. Package reliability is not degraded by, e.g., deterioration of tight contact between the first region where the bump is formed, and the bump.

To achieve the above object, according to the third aspect of the present invention, there is provided a semiconductor device comprising, a semiconductor chip on which a semiconductor circuit is formed, a first bonding pad formed on a surface of the semiconductor chip, a first insulating substrate formed on the semiconductor chip in which an opening is formed to expose part of a surface of the semiconductor chip including the first bonding pad, a wiring layer formed on the first insulating substrate, a wire for electrically connecting the wiring layer and the first bonding pad, a second insulating substrate formed on the wiring layer, an insulating resin formed to cover the wire and the surface of the semiconductor chip including the first bonding pad that is exposed in the opening of the first insulating substrate, and a region of the wiring layer where an opening is formed in the second insulating substrate to expose part of the surface of the wiring layer, the region having a first region where a bump is formed, and a second region where no bump is formed, the second region allowing contact of a terminal of a measurement device in operation measurement.

In the semiconductor device having this arrangement, the terminal of the measurement device is connected in operation measurement to the second region for inspection where no external connection bump in the region is formed. Accordingly, the first region where the bump is formed is not damaged. Package reliability is not degraded by, e.g., deterioration of tight contact between the first region where the bump is formed, and the bump.

To achieve the above object, according to the fourth aspect of the present invention, there is provided a semiconductor device comprising, a semiconductor chip on which a semiconductor circuit is formed, a first insulating substrate formed on the semiconductor chip, a wiring layer which is formed on the first insulating substrate and electrically connected to the semiconductor circuit, a second insulating substrate formed on the wiring layer, a first region where an opening is formed in the second insulating substrate to expose part of a surface of the wiring layer, and a second region where an opening is formed in the second insulating substrate to expose part of the surface of the wiring layer, the second region allowing contact of a terminal of a measurement device in operation measurement.

In the semiconductor device having this arrangement, the terminal of a measurement device is connected in operation measurement not to the first region where an external connection bump is to be formed, but to the second region as the inspection region. Thus, the first region is not damaged. Package reliability is not degraded by, e.g., deterioration of tight contact between the first region and bump.

To achieve the above object, according to the fifth aspect of the present invention, there is provided a semiconductor device comprising, a semiconductor chip on which a semiconductor circuit is formed, a first insulating substrate formed on the semiconductor chip, a wiring layer which is formed on the first insulating substrate and electrically connected to the semiconductor circuit, a second insulating substrate formed on the wiring layer, a region where an opening is formed in the second insulating substrate to expose part of a surface of the wiring layer, and a region where an opening is formed in the second insulating substrate to expose part of a surface of the wiring layer, the region having a first region where a bump is formed, and a second region where no bump is formed, the second region allowing contact of a terminal of a measurement device in operation measurement.

In the semiconductor device having this arrangement, the terminal of the measurement device is connected in operation measurement to the second region for inspection where no external connection bump in the region is formed. Accordingly, the first region where the bump is formed is not damaged. Package reliability is not degraded by, e.g., deterioration of tight contact between the first region where the bump is formed, and the bump.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of a semiconductor device according to the present invention will be described below with reference to the several views of the accompanying drawings.

[First Embodiment]

Figure 2A:
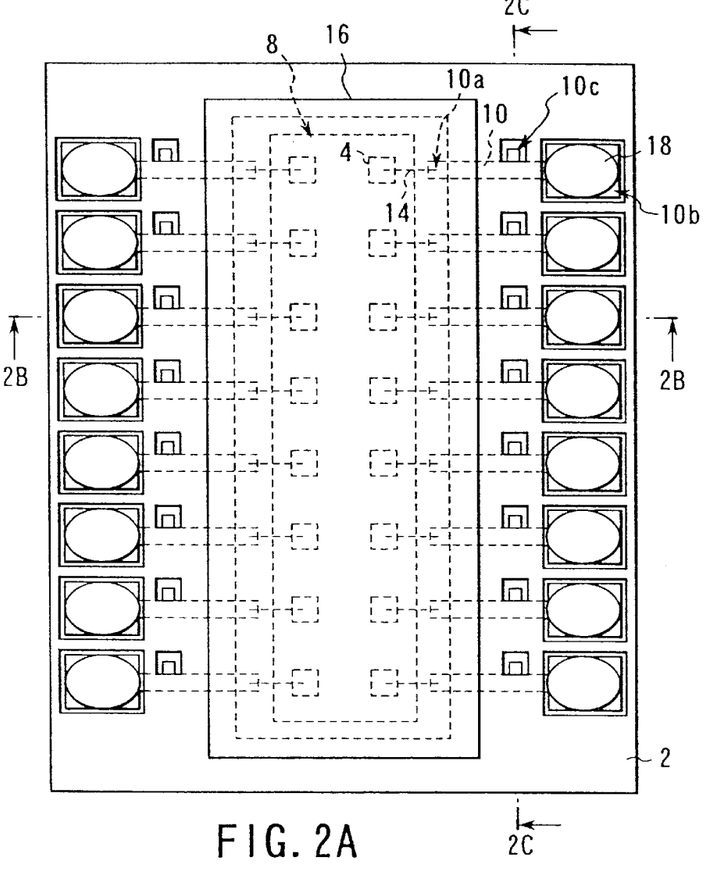
FIG. 2A is a plan view showing the arrangement of a package according to the first embodiment of the present invention.
Figure 2B:
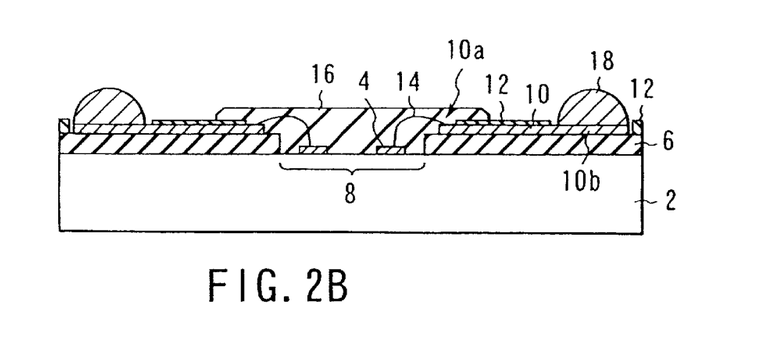
FIG. 2B is a sectional view showing the package in FIG. 2A taken along the line 2B—2B.
Figure 2C:
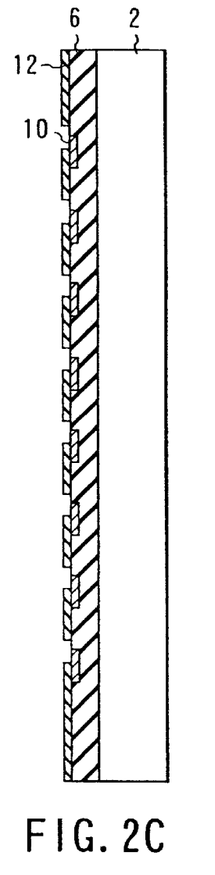
FIG. 2C is a sectional view showing the package in FIG. 2A taken along the line 2C—2C.

FIG. 2A is a plan view showing the arrangement of a package according to the first embodiment of the present invention. FIG. 2B is a sectional view showing the package in FIG. 2A taken along the line 2B—2B. FIG. 2C is a sectional view showing the package in FIG. 2A taken along the line 2C—2C. This package is a center pad device in which pads serving as semiconductor circuit terminals are arranged near the center of a chip.

As shown in FIGS. 2A, 2B, and 2C, pads 4 serving as semiconductor circuit terminals are arranged near the center of a chip 2 on which a semiconductor circuit is formed. An organic substrate 6 called an interposer is formed on the chip 2. The organic substrate 6 has an opening 8 for exposing the pads 4.

A wiring pattern 10 like the one shown in FIGS. 2A and 2B is formed on the organic substrate 6. The wiring pattern 10 has bonding regions 10a for bonding wires, near the pads 4 on the center side of the chip 2, and bump formation regions 10b for forming bumps, at the periphery of the chip 2.

Rectangular inspection pad regions 10c used for connection in inspection are formed on the wiring pattern 10 between the bonding regions 10a and bump formation regions 10b. These inspection pad regions 10c are formed near the bump formation regions 10b, and serve as inspection pads which are connected to the needles or bumps of a measurement device in order to screen non-defective and defective chips 2 and evaluate characteristics.

An organic substrate 12 is formed on this structure. The organic substrate 12 has an opening so as to expose the bonding regions 10a, opening 8, bump formation regions 10b, and inspection pad regions 10c. The organic substrates 6 and 12 are made of a polyimide film.

Wires 14 for electrically connecting the pads 4 and bonding regions 10a are bonded between them. An insulating film 16 for covering, sealing, and protecting the wires 14 and the surface of the chip 2 is formed over the opening 8 in which the wires 14 are bonded. The insulating film 16 is generally made of a molded resin. Bumps 18 for connecting an external printed board or the like are formed from solder or gold (Au) in the bump formation regions 10b of the wiring pattern 10.

Screening of non-defectives and measurement of various characteristics for the package having the arrangement as shown in FIGS. 2A, 2B, and 2C will be described.

When screening of non-defectives and measurement of various characteristics are to be done for the package according to the first embodiment, the terminals of the measurement device are connected to the inspection pad regions 10c. This measurement forms contact scratches in the inspection pad regions 10c. However, the inspection pad regions 10c are dedicated for inspection, so the contact scratches do not influence package reliability.

Measurement using a membrane probe card will be explained with reference to FIG. 3. A membrane probe card 19 is constituted by forming a ground potential layer 24 and signal wiring layers 26 in a polyimide film 22 so as to face each other, and adjusting the loads of the signal wiring layers 26 to a predetermined impedance.

Figure 3:
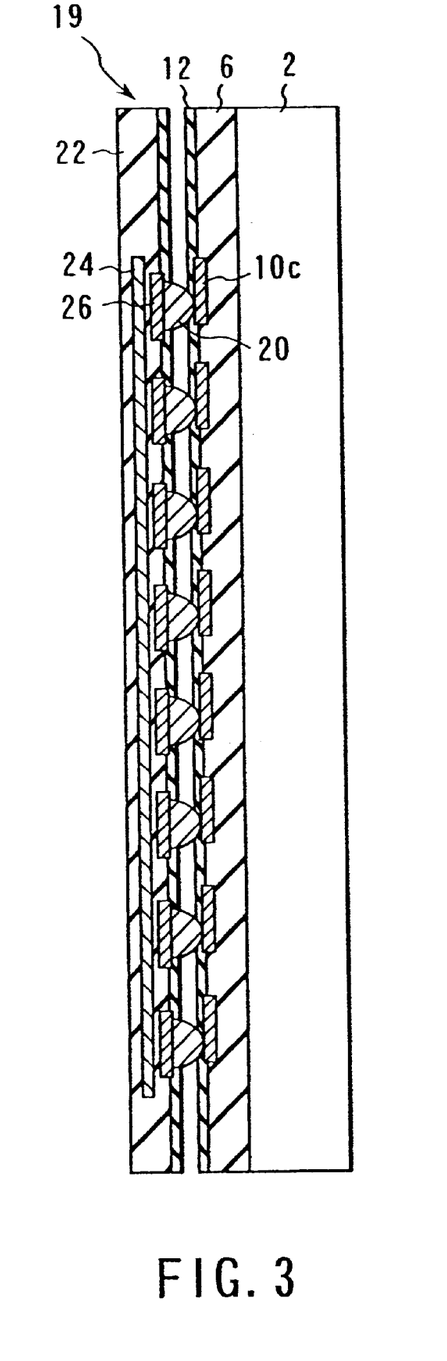
FIG. 3 is a sectional view showing the state in which a membrane probe card is connected to the package according to the first embodiment.

As shown in FIG. 3, this measurement is performed by connecting bumps 20 of the membrane probe card 19 serving as the terminals of the measurement device to the inspection pad regions 10c before forming the bumps 18 in the bump formation regions 10b of the package.

The measurement using the membrane probe card 19 also forms contact scratches in the inspection pad regions 10c, but the contact scratches do not influence package reliability. Further, since the loads of the signal wiring layers 26 can be adjusted to a predetermined impedance in the membrane probe card 19, the impedance is not matched at only the bumps 20 of the membrane probe card 19. However, the bumps 20 are as short as several ten $\mu$m, the impedance is substantially matched, and original package characteristics can be measured.

In the package of the first embodiment, the membrane probe card 19 is connected not to the regions 10b where the external connection bumps 18 are formed, but to the inspection pad regions 10c. The bump formation regions 10b are not damaged. Accordingly, package reliability is not degraded by, e.g., deterioration of tight contact between the bump formation regions 10b and bumps 18.

The measurement method using the membrane probe card can shorten the wiring portion at which the impedance is not matched in the wiring pattern for connecting the measurement device and package, and can set a load almost equal to that of a package as a final product. Accordingly, the characteristics of the package as a final product can be measured. That is, since the impedance is matched up to the vicinity of the connected portion in the measurement method using the membrane probe card, the package can be evaluated in almost the same environment as in mounting.

Note that the inspection step after bump formation can be omitted if screening of non-defectives and measurement of various characteristics are practiced before bump formation, as described above. This can reduce damage such as contact scratches to the bumps 18 in the inspection step.

A package manufactured by adhering a wafer-like interposer equal in diameter to a wafer, connecting wires, and sealing a resin can be inspected using a general wafer evaluation method and measurement device. This package can attain high inspection throughput, and device characteristics as a final product can be measured.

Even when the inspection step is practiced after bump formation, damage to the formed bumps 18 can be reduced by using the inspection pad regions 10c dedicated for measurement.

As described above, the first embodiment can easily measure the device characteristics of a package without damaging pads (regions) on which external connection bumps are to be formed, and degrading package reliability. The first embodiment has exemplified a center pad device in which pads serving as semiconductor circuit terminals are arranged near the center of a chip. However, the present invention is not limited to this, and can also be applied to a device in which pads are arranged near the periphery of a chip.

[Second Embodiment]

A semiconductor device according to the second embodiment of the present invention will be described.

Figure 4A:
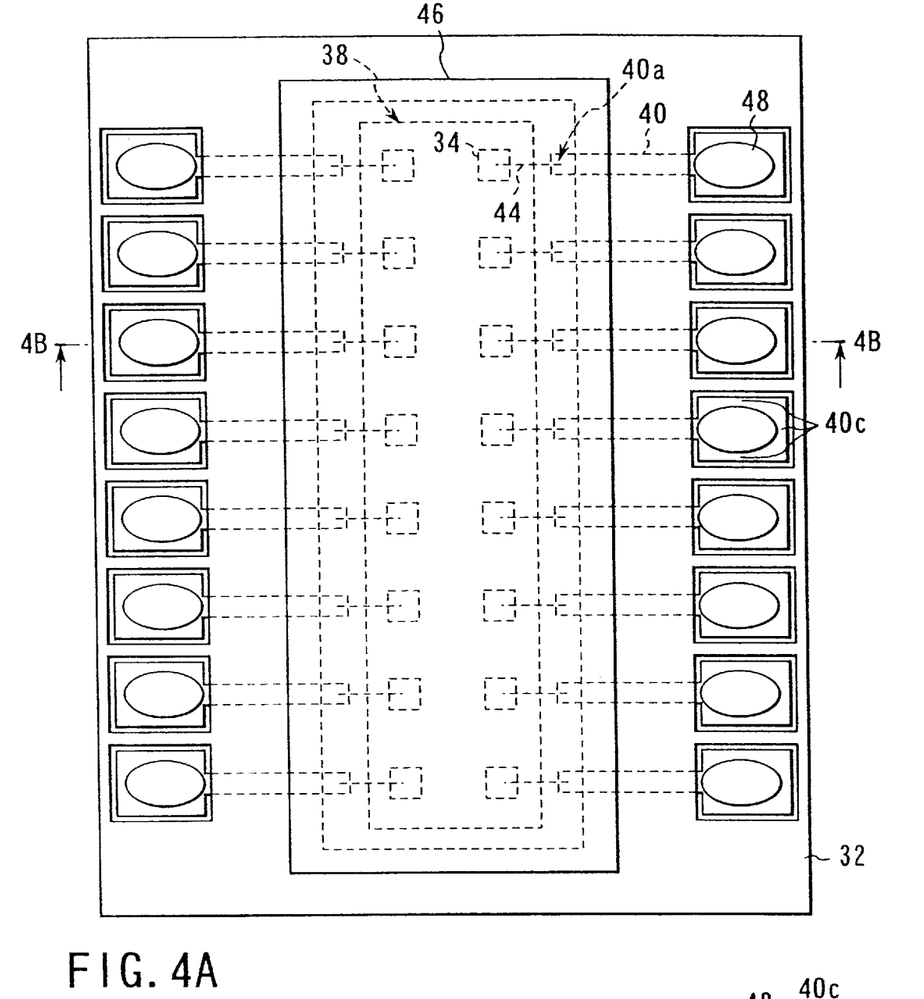
FIG. 4A is a plan view showing the arrangement of a package according to the second embodiment of the present invention.
Figure 4B:
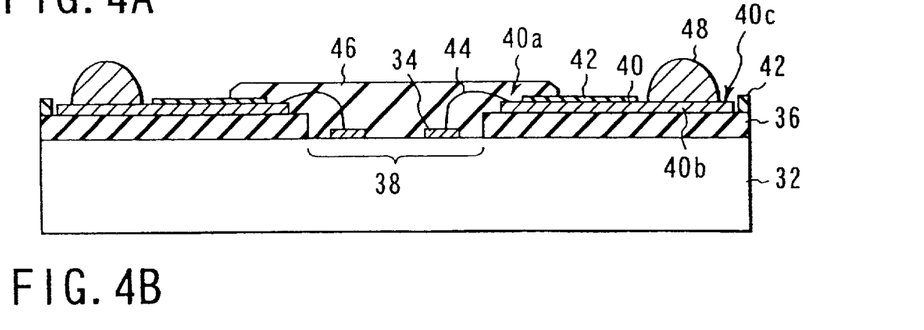
FIG. 4B is a sectional view showing the package in FIG. 4A taken along the line 4B—4B.

FIG. 4A is a plan view showing the arrangement of a package according to the second embodiment. FIG. 4B is a sectional view showing the package in FIG. 4A taken along the line 4B—4B. This package is a center pad device in which pads serving as semiconductor circuit terminals are arranged near the center of a chip.

As shown in FIGS. 4A and 4B, pads 34 serving as semiconductor circuit terminals are arranged near the center of a chip 32 on which a semiconductor circuit is formed. An organic substrate 36 called an interposer is formed on the chip 32. The organic substrate 36 has a rectangular opening 38 for exposing the pads 34.

A wiring pattern 40 like the one shown in FIGS. 4A and 4B is formed on the organic substrate 36. The wiring pattern 40 has bonding regions 40a for bonding wires, near the pads 34. Further, the wiring pattern 40 has, at the periphery of the chip 32, rectangular regions with bump formation regions 40b and inspection regions 40c. The rectangular regions may be changed into another shape. The bump formation regions 40b are used to form bumps, and the inspection regions 40c are used to connect external terminals in operation measurement.

Each rectangular region has a width larger than the diameter of a bump 48 formed in this region. In the rectangular region, the inspection region 40c is ensured. For example, as shown in FIG. 4A, a region where no bump is formed, i.e., the inspection region 40c which is brought into contact with the terminal of a measurement device in operation measurement is formed beside the bump 48. The inspection region 40c ensures a region which allows contact of the bump of a membrane probe card or the like in operation measurement. The inspection region 40c desirably has a rectangular region of 25 μm×25 μm or more. In other words, the inspection region 40c desirably has a rectangular region of at least 25 μm×25 μm.

An organic substrate 42 is formed on this structure. The organic substrate 42 has an opening so as to expose the opening 38, bonding regions 40a, bump formation regions 40b, and inspection regions 40c. The organic substrates 36 and 42 are made of a polyimide film.

Wires 44 for electrically connecting the pads 34 and bonding regions 40a are bonded between them. An insulating film 46 for covering, sealing, and protecting the wires 44 and the surface of the chip 32 is formed over the opening 38 in which the wires 44 are bonded. The insulating film 46 is generally made of a molded resin. The bumps 48 for connecting an external printed board or the like are formed from solder or gold (Au) in the bump formation regions 40b of the wiring pattern 40. The bumps 48 are formed to ensure the inspection regions 40c where no bumps 48 exist.

Screening of non-defectives and measurement of various characteristics for the package having the arrangement as shown in FIGS. 4A and 4B will be described.

When screening of non-defectives and measurement of various characteristics are to be done for the package according to the second embodiment, the terminals of the measurement device are connected to the inspection regions 40c where no bumps 48 in the rectangular regions are formed. This measurement forms contact scratches in the inspection regions 40c. However, the inspection regions 40c are dedicated for inspection, so the contact scratches do not influence package reliability.

Figure 5:
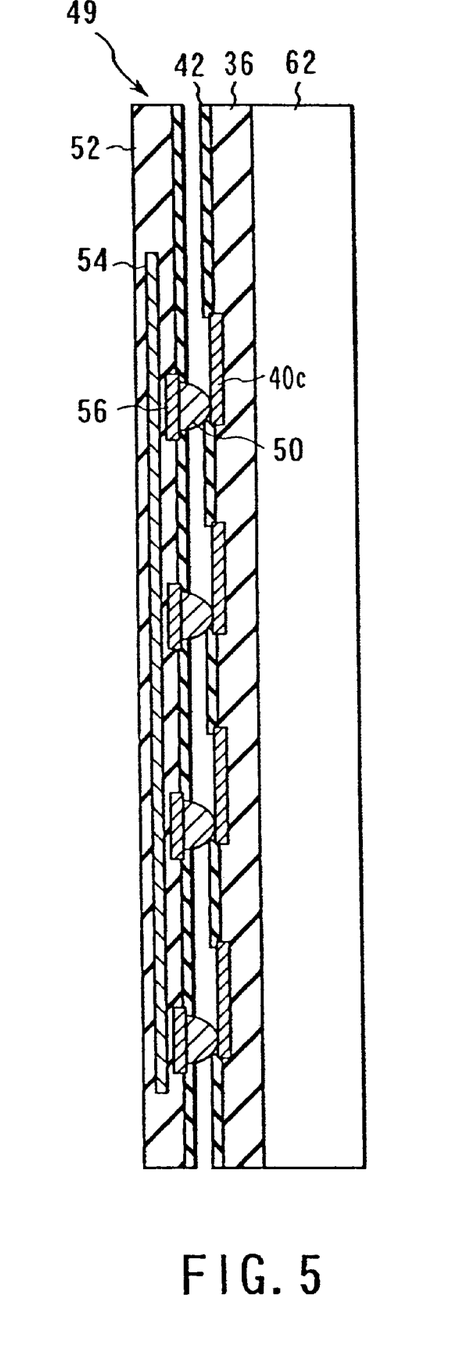
FIG. 5 is a sectional view showing the state in which the membrane probe card is connected to the package according to the second embodiment.

As shown in FIG. 5, measurement may be performed by connecting bumps 50 of a membrane probe card 49 serving as the terminals of the measurement device to the inspection regions 40c before forming the bumps 48 in the bump formation regions 40b of the package. The membrane probe card 49 is constituted by forming a ground potential layer 54 and signal wiring layers 56 in a polyimide film 52 so as to face each other, and adjusting the loads of the signal wiring layers 56 to set a predetermined impedance.

The measurement using the membrane probe card also forms contact scratches in the inspection regions 40c, but the contact scratches do not influence package reliability. Further, since the loads of the signal wiring layers 56 can be adjusted to a predetermined impedance in the membrane probe card, the impedance is not matched at only the bumps 50 of the membrane probe card 49. However, the bumps 50 are as short as several ten μm, the impedance is substantially matched, and original package characteristics can be measured.

In the package of the second embodiment, the membrane probe card 49 is connected not to the regions where the external connection bumps 48 are formed, but to the inspection regions 40c. Thus, the regions where the bumps 48 are formed in the rectangular regions are not damaged. For this reason, package reliability is not degraded by, e.g., deterioration of tight contact between the bump formation regions 40b and bumps 48.

The measurement method using the membrane probe card can shorten the wiring portion at which the impedance is not matched in the wiring pattern for connecting the measurement device and package, and can set a load almost equal to that of a package as a final product. Accordingly, the characteristics of the package as a final product can be measured. That is, since the impedance is matched up to the vicinity of the connected portion in the measurement method using the membrane probe card, the package can be evaluated in almost the same environment as in mounting. Furthermore, the final characteristics of the package can be accurately evaluated by bringing, in measurement, the terminals of the measurement device into contact with prospective regions for the bump formation regions 40b where the bumps 48 are to be formed.

Note that the inspection step after bump formation can be omitted if screening of non-defectives and measurement of various characteristics are practiced before bump formation, as described above. This can reduce damage such as contact scratches to the bumps 48 in the inspection step.

A package manufactured by adhering a wafer-like interposer equal in diameter to a wafer, connecting wires, and sealing a resin can be inspected using a general wafer evaluation method and measurement device. This package can attain high inspection throughput, and device characteristics as a final product can be measured.

Even when the inspection step is practiced after bump formation, damage to the formed bumps 48 can be reduced by using the inspection regions 40c dedicated for measurement.

As described above, the second embodiment can easily measure the device characteristics of a package without damaging regions on which external connection bumps are to be formed, and degrading package reliability. The second embodiment has exemplified a center pad device in which pads serving as semiconductor circuit terminals are arranged near the center of a chip. However, the present invention is not limited to this, and can also be applied to a device in which pads are arranged near the periphery of a chip.

[Third Embodiment]

A semiconductor device according to the third embodiment of the present invention will be described.

Figure 6A:
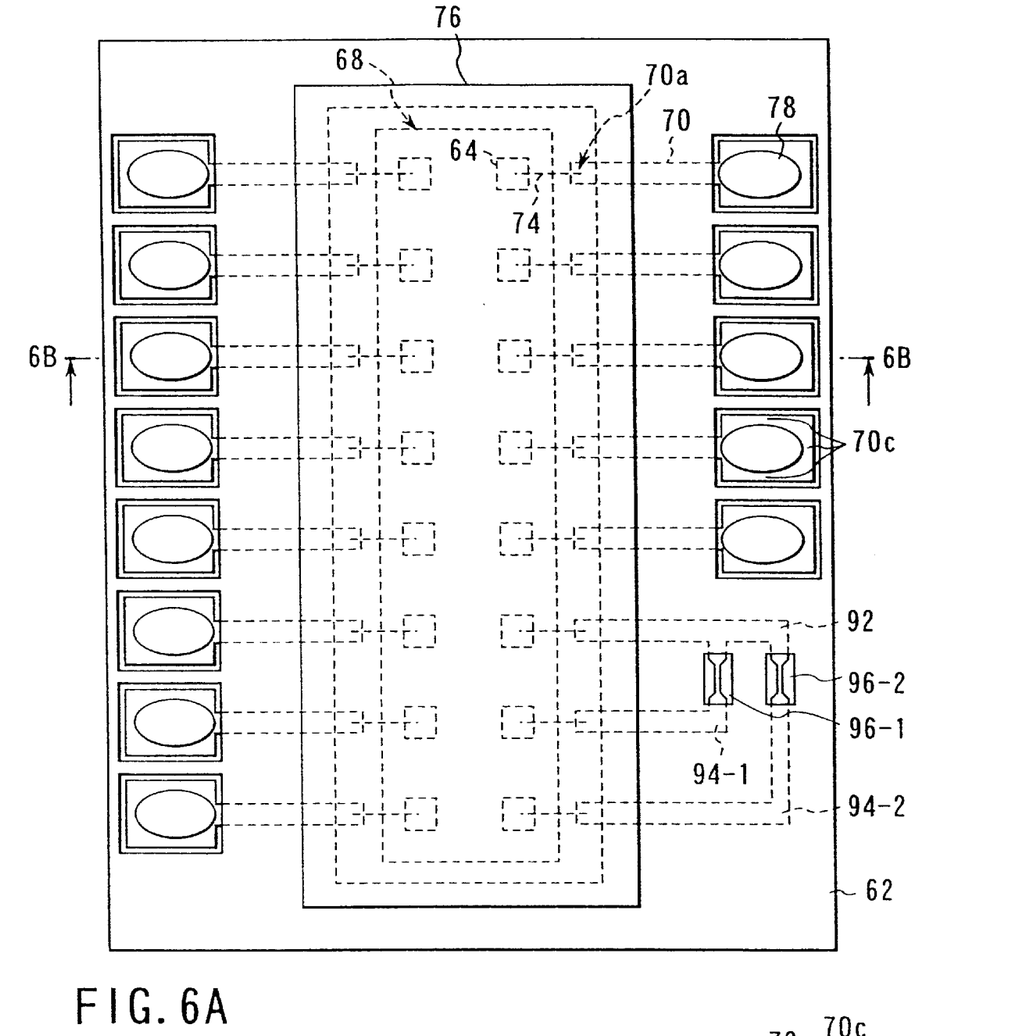
FIG. 6A is a plan view showing the arrangement of a package according to the third embodiment of the present invention.
Figure 6B:
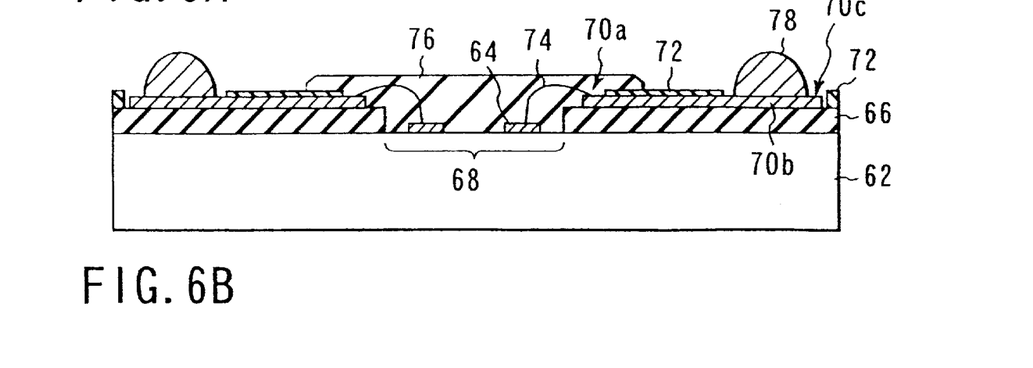
FIG. 6B is a sectional view showing the package in FIG. 6A taken along the line 6B—6B.

FIG. 6A is a plan view showing the arrangement of a package according to the third embodiment. FIG. 6B is a sectional view showing the package in FIG. 6A taken along the line 6B—6B. This package is a center pad device in which pads serving as semiconductor circuit terminals are arranged near the center of a chip.

As shown in FIGS. 6A and 6B, pads 64 serving as semiconductor circuit terminals are arranged near the center of a chip 62 on which a semiconductor circuit is formed. An organic substrate 66 called an interposer is formed on the chip 62. The organic substrate 66 has a rectangular opening 68 for exposing the pads 64.

A wiring pattern 70 like the one shown in FIGS. 6A and 6B is formed on the organic substrate 66. The wiring pattern 70 has bonding regions 70a for bonding wires, near the pads 64. Further, the wiring pattern 70 has, at the periphery of the chip 62, rectangular regions with bump formation regions 70b and inspection regions 70c. The rectangular regions may be changed into another shape. The bump formation regions 70b are used to form bumps, and the inspection regions 70c are used to connect external terminals in operation measurement.

Each rectangular region has a width larger than the diameter of a bump 78 formed in this region. In the rectangular region, the inspection region 70c is ensured. For example, as shown in FIG. 6A, a region where no bump is formed, i.e., the inspection region 70c which is brought into contact with the terminal of a measurement device in operation measurement is formed beside the bump 78. The inspection region 70c ensures a region which allows contact of the bump of a membrane probe card or the like in operation measurement. The inspection region 70c desirably has a rectangular region of 25 $\mu$m×25 $\mu$m or more. In other words, the inspection region 70c desirably has a rectangular region of at least 25 $\mu$m×25 $\mu$m.

An organic substrate 72 is formed on this structure. The organic substrate 72 has an opening so as to expose the opening 68, bonding regions 70a, bump formation regions 70b, and inspection regions 70c. The organic substrates 66 and 72 are made of a polyimide film.

Wires 74 for connecting the pads 64 and bonding regions 70a are bonded between them. An insulating film 76 for covering, sealing, and protecting the wires 74 and the surface of the chip 62 is formed over the opening 68 in which the wires 74 are bonded. The insulating film 76 is generally made of a molded resin. The bumps 78 for connecting an external printed board or the like are formed from solder or gold (Au) in the bump formation regions 70b of the wiring pattern 70. The bumps 78 are formed to ensure the inspection regions 70c where no bumps 78 exist.

A redundancy circuit and other circuit blocks formed on the chip will be explained.

A redundancy circuit, delay circuit, output circuit, and internal clock generation circuit are formed on the chip 62. The redundancy circuit outputs a signal for adjusting the timing of a clock signal. The delay circuit adjusts the timing of the clock signal using the redundancy circuit. The output circuit processes and outputs data. The internal clock generation circuit generates an internal clock signal from an external clock signal.

Figure 7:
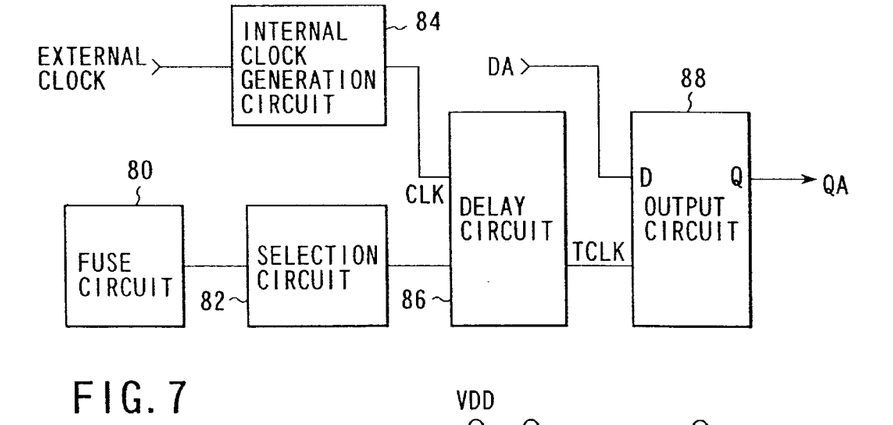
FIG. 7 is a block diagram showing the arrangements of a redundancy circuit according to the third embodiment and a circuit block for processing data using an output from the redundancy circuit.

FIG. 7 is a block diagram showing the arrangements of the redundancy circuit and a circuit block for processing data using an output from the redundancy circuit.

The redundancy circuit, a delay circuit 86, an output circuit 88, and an internal clock generation circuit 84 are connected, as shown in FIG. 7. The redundancy circuit is made up of a fuse circuit 80 and selection circuit 82. The fuse circuit 80 has n (=1, 2, 3, . . . , n) fuses, and outputs n-bit register information to the selection circuit 82 in accordance with the presence/absence of disconnection of these fuses. The selection circuit 82 receives the register information, and outputs a selection signal for selecting the delay time in accordance with the register information.

The internal clock generation circuit 84 receives an external clock signal (external clock), and generates an internal clock signal CLK used in the semiconductor circuit. The delay circuit 86 receives the selection signal and internal clock signal CLK, and sets the delay time of the internal clock signal CLK in accordance with the selection signal. The delay circuit 86 delays the internal clock signal CLK to generate a timing-adjusted clock signal TCLK. The output circuit 88 receives data DA and the clock signal TCLK, and processes the data DA in accordance with the timing of the clock signal TCLK to output data QA.

The circuit arrangements of the redundancy circuit and circuit block will be described.

Figure 8:
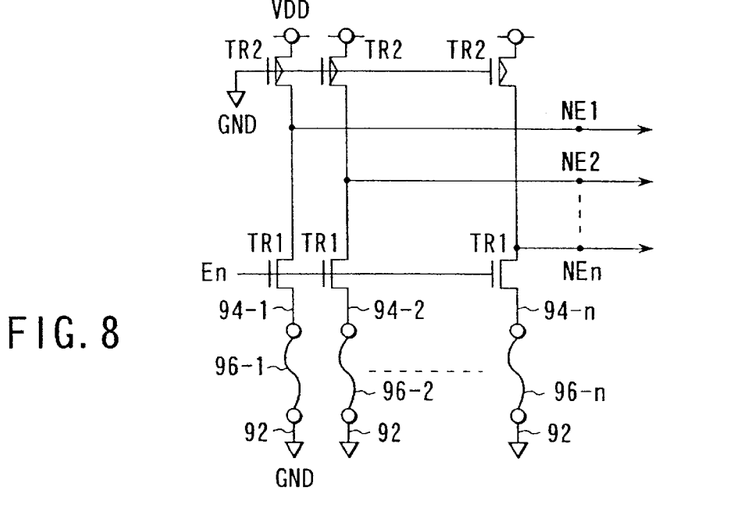
FIG. 8 is a circuit diagram showing the arrangement of a fuse circuit in the redundancy circuit.

FIG. 8 is a circuit diagram showing the arrangement of the fuse circuit 80.

Fuses 96-1 to 96-n are respectively interposed between wiring lines 92 for supplying a ground voltage GND, and n wiring lines 94-1 to 94-n (n=1, 2, 3, . . . , n). Each of the n wiring lines 94-1 to 94-n is connected to one end of the current path of a corresponding one of n n-channel transistors TR1, and the other end of the current path of each n-channel transistor TR1 is connected to one end of the current path of a corresponding one of p-channel transistors TR2. The other end of the current path of each p-channel transistor TR2 is connected to a power supply voltage VDD.

A fuse comparate signal En is commonly input to the gates of the n-channel transistors TR1. The ground voltage GND is commonly supplied to the gates of the p-channel transistors TR2. N nodes (nodes NE1 to NEn) between the n-channel and p-channel transistors TR1 and TR2 are connected to the selection circuit 82.

FIG. 6A shows the wiring line 92, the wiring lines 94-1 and 94-2, and the fuses 96-1 and 96-2 interposed between them. The fuses 96-1 and 96-2 are formed from a wiring pattern having a smaller width than a general wiring pattern width, from which the organic substrate 72 is removed. The thin pattern of the fuses 96-1 and 96-2 can be disconnected with a laser or the like in accordance with the situation.

Figure 9:
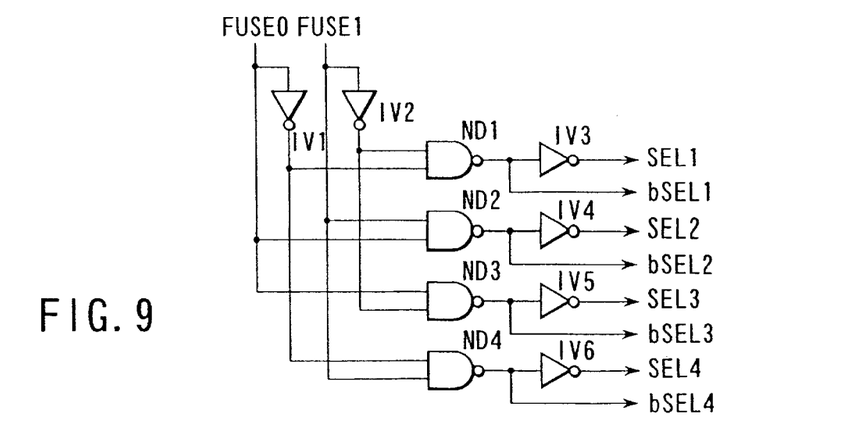
FIG. 9 is a circuit diagram showing the arrangement of a selection circuit in the redundancy circuit.

FIG. 9 is a circuit diagram showing the arrangement of the selection circuit 82.

Although the fuse circuit 80 outputs n register information (FUSE0 to FUSEn-1), the case of inputting two signals FUSE0 and FUSE1 to the selection circuit 82 will be exemplified.

The signal FUSE0 is input to the first terminals of NAND circuits ND1 and ND4 via an inverter IV1. Further, the signal FUSE0 is directly input to the first terminals of NAND circuits ND2 and ND3.

The signal FUSE1 is input to the second terminals of the NAND circuits ND1 and ND3 via an inverter IV2. Further, the signal FUSE1 is directly input to the second terminals of the NAND circuits ND2 and ND4.

The NAND circuit ND1 outputs a signal bSEL1, and a signal SEL1 obtained by inverting the signal bSEL1 by an inverter IV3. The NAND circuit ND2 outputs a signal bSEL2, and a signal SEL2 obtained by inverting the signal bSEL2 by an inverter IV4. The NAND circuit ND3 outputs a signal bSEL3, and a signal SEL3 obtained by inverting the signal bSEL3 by an inverter IV5. The NAND circuit ND4 outputs a signal bSEL4, and a signal SEL4 obtained by inverting the signal bSEL4 by an inverter IV6.

Figure 10:
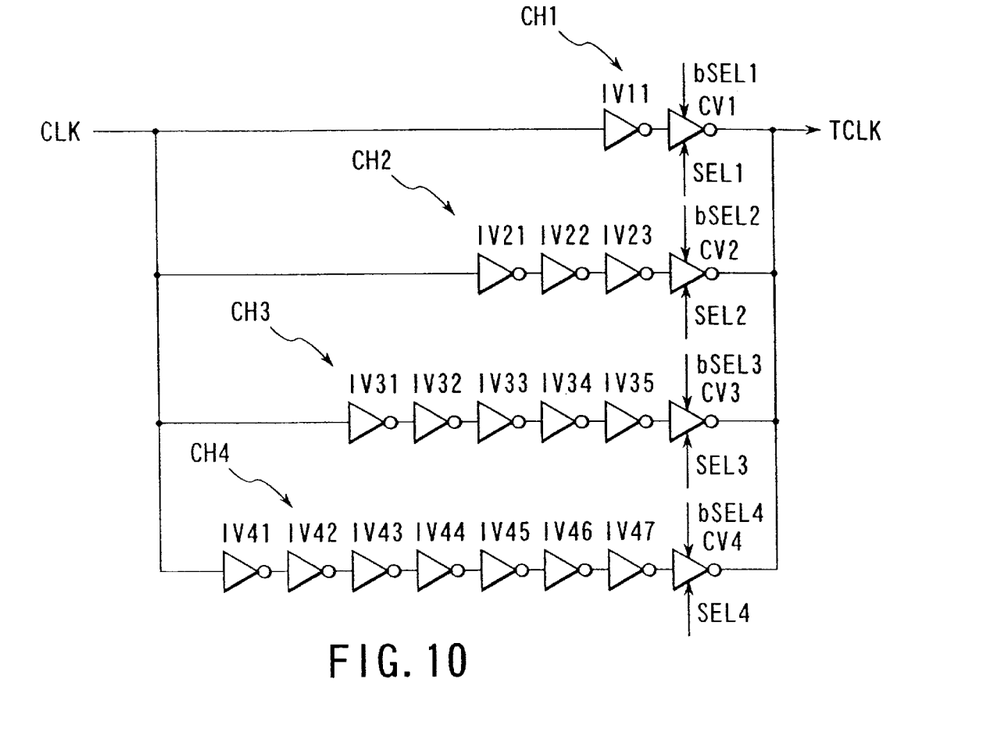
FIG. 10 is a circuit diagram showing the arrangement of a delay circuit in the redundancy circuit.

FIG. 10 is a circuit diagram showing the arrangement of the delay circuit 86.

The delay circuit 86 receives the internal clock signal CLK generated by the internal clock generation circuit 84. The delay circuit 86 inputs the received internal clock signal CLK to a first inverter chain CHI for delaying the signal by a delay of two inverters, a second inverter chain CH2 for delaying the signal by a delay of four inverters, a third inverter chain CH3 for delaying the signal by a delay of six inverters, and a fourth inverter chain CH4 for delaying the signal by a delay of eight inverters.

The first inverter chain CH1 is made up of an inverter IV11 and clocked inverter CV1. The clocked inverter CV1 receives the signals SEL1 and bSEL1 to control an output from the clocked inverter CV1. The second inverter chain CH2 is made up of inverters IV21, IV22, and IV23, and a clocked inverter CV2. The clocked inverter CV2 receives the signals SEL2 and bSEL2 to control an output from the clocked inverter CV2.

The third inverter chain CH3 is made up of inverters IV31, IV32, IV33, IV34, and IV35, and a clocked inverter CV3. The clocked inverter CV3 receives the signals SEL3 and bSEL3 to control an output from the clocked inverter CV3. The fourth inverter chain CH4 is made up of inverters IV41, IV42, IV43, IV44, IV45, IV46, and IV47, and a clocked inverter CV4. The clocked inverter CV4 receives the signals SEL4 and bSEL4 to control an output from the clocked inverter CV4. The delay circuit 86 delays the internal clock signal CLK to output a timing-adjusted clock signal TCLK to the output circuit 88.

The output circuit 88 receives the clock signal TCLK and data DA, and processes the data DA in accordance with the timing of the clock signal TCLK to output data QA.

Operation of the redundancy circuit and circuit block shown in FIG. 7 having these arrangements will be explained.

The fuse circuit 80 shown in FIG. 8 operates as follows. The ground voltage GND is input to the gates of the p-channel transistors TR2. The fuse comparate signal En is input to the gates of the n-channel transistors TR1. The fuse comparate signal En is generally a power-on signal which is activated (rises to "H") when a signal of an internal reference level is normally output after the power supply voltage VDD rises. When the power supply voltage VDD has not risen, no power supply voltage VDD is supplied to the p-channel transistors TR2, and the nodes NE1 to NEn change to "L" to output an "L" signal to the selection circuit 82.

When the power supply voltage VDD rises, the nodes NE1 to NEn are charged to "H" because an "L" signal is input to the gates of the p-channel transistors TR2 to turn them on. An "H" fuse comparate signal En is input to the gates of the n-channel transistors TR1 to turn them on.

If, for example, the fuse 96-1 is not disconnected, the node NE1 connected to the fuse 96-1 fall to "L" to output an "L" signal to the selection circuit 82. To the contrary, if the fuse 96-1 is disconnected, the node NE1 connected to the fuse 96-1 is held at "H" to output an "H" signal to the selection circuit 82.

Similarly, as for the remaining nodes NE2 to NEn, a node connected to a fuse not disconnected falls to "L" to output an "L" signal to the selection circuit 82, whereas a fuse connected to a disconnected fuse is held at "H" to output an "H" signal to the selection circuit 82.

In this manner, the fuse circuit 80 changes the n nodes NE1 to NEn to "H" or "L" in accordance with the presence/absence of disconnection of the n fuses 96-1 to 96-n after the power supply voltage VDD rises. The node changes to "H" when the fuse is disconnected, and to "L" when the fuse is not disconnected. As a result, n-bit register information can be output to the selection circuit 82.

Operation of the selection circuit 82 shown in FIG. 9 will be described.

This operation will be exemplified using the signal FUSE0 which is set by the presence/absence of disconnection of the fuse 96-1 and output from the node NE1, and the signal FUSE1 which is set by the presence/absence of disconnection of the fuse 96-2 and output from the node NE2.

Figure 11:
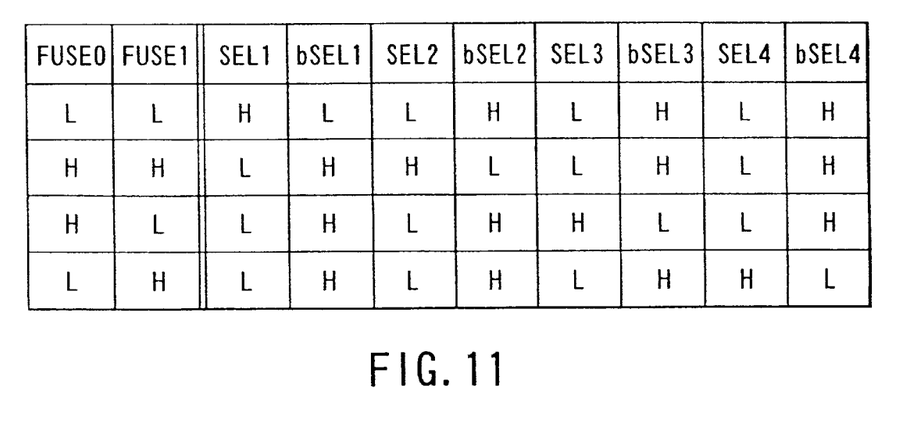
FIG. 11 is a table showing the relationship between an input and output in the selection circuit.

(FUSE0, FUSE1) takes four pieces of register information (L, L), (H, H), (H, L), and (L, H) in accordance with the presence/absence of disconnection of the fuses 96-1 and 96-2. In these cases, the signals SEL1, bSEL1, SEL2, bSEL2, SEL3, bSEL3, SEL4, and bSEL4 output from the selection circuit 82 change as shown in FIG. 11.

Operation of the delay circuit 86 shown in FIG. 10 will be described.

As shown in FIG. 7, the internal clock generation circuit 84 connected to the delay circuit 86 receives an external clock signal (external clock). The internal clock generation circuit 84 generates an internal clock signal CLK based on this external clock.

The internal clock signal CLK is input to the delay circuit 86. The internal clock signal CLK input to the delay circuit 86 is input to the first inverter chain CH1 for delaying the signal by a delay of two inverters, the second inverter chain CH2 for delaying the signal by a delay of four inverters, the third inverter chain CH3 for delaying the signal by a delay of six inverters, and the fourth inverter chain CH4 for delaying the signal by a delay of eight inverters.

When (FUSE0, FUSEL) is (L, L), (SEL1, bSEL1) input to the clocked inverter CV1 is (H, L). Then, the clocked inverter CV1 is turned on to output a clock signal TCLK obtained by delaying the internal clock signal CLK by the delay of two inverters.

On the other hand, all (SEL2, bSEL2), (SEL3, bSEL3), and (SEL4, bSEL4) respectively input to the clocked inverters CV2, CV3, and CV4 are (L, H). Then, all the clocked inverters CV2, CV3, and CV4 change to high impedance, so outputs from them are disabled. Hence, when (FUSE0, FUSE1) output from the fuse circuit 80 is (L, L), the delay circuit 86 outputs the clock signal TCLK obtained by delaying the internal clock signal CLK by the delay of two inverters.

When (FUSE0, FUSE1) is (H, H), (SEL2, bSEL2) input to the clocked inverter CV2 is (H, L). Then, the clocked inverter CV2 is turned on to output a clock signal TCLK obtained by delaying the internal clock signal CLK by the delay of four inverters.

On the other hand, all (SEL1, bSEL1), (SEL3, bSEL3), and (SEL4, bSEL4) respectively input to the clocked inverters CV1, CV3, and CV4 are (L, H). Then, all the clocked inverters CV1, CV3, and CV4 change to high impedance, so outputs from them are disabled. Therefore, when (FUSE0, FUSE1) output from the fuse circuit 80 is (H, H), the delay circuit 86 outputs the clock signal TCLK obtained by delaying the internal clock signal CLK by the delay of four inverters.

When (FUSE0, FUSE1) is (H, L), (SEL3, bSEL3) input to the clocked inverter CV3 is (H, L). Then, the clocked inverter CV3 is turned on to output a clock signal TCLK obtained by delaying the internal clock signal CLK by the delay of six inverters. At this time, all (SEL1, bSEL1), (SEL2, bSEL2), and (SEL4, bSEL4) respectively input to the clocked inverters CV1, CV2, and CV4 are (L, H). Then, all the clocked inverters CV1, CV2, and CV4 change to high impedance, so outputs from them are disabled. Therefore, when (FUSE0, FUSE1) output from the fuse circuit 80 is (H, L), the delay circuit 86 outputs the clock signal TCLK obtained by delaying the internal clock signal CLK by the delay of six inverters.

When (FUSE0, FUSE1) is (L, H), (SEL4, bSEL4) input to the clocked inverter CV4 is (H, L). Then, the clocked inverter CV4 is turned on to output a clock signal TCLK obtained by delaying the internal clock signal CLK by the delay of eight inverters. At this time, all (SEL1, bSEL1), (SEL2, bSEL2), and (SEL3, bSEL3) respectively input to the clocked inverters CV1, CV2, and CV3 are (L, H). Then, all the clocked inverters CV1, CV2, and CV3 change to high impedance, so outputs from them are disabled. Therefore, when (FUSE0, FUSE1) output from the fuse circuit 80 is (L, H), the delay circuit 86 outputs the clock signal TCLK obtained by delaying the internal clock signal CLK by the delay of eight inverters.

In this way, the delay circuit 86 receives n-bit register information output from the n nodes NE1 to NEn, and selects an output from one inverter chain among a plurality of inverter chains having different numbers of inverters. By this output, the delay circuit 86 delays the input internal clock signal CLK and adjusts its timing to output the clock signal TCLK.

Operation of the output circuit 88 will be described.

The output circuit 88 receives the clock signal TCLK and data DA. The output circuit 88 processes to output data QA in accordance with the timing of the clock signal TCLK.

Screening of non-defectives and measurement of various characteristics for the package having the arrangement as shown in FIGS. 6A and 6B will be described.

When screening of non-defectives and measurement of various characteristics are to be done for the package according to the third embodiment, the terminals of the measurement device are connected to the inspection regions 70c where no bumps 78 in the rectangular regions are formed. This measurement forms contact scratches in the inspection regions 70c. However, the inspection regions 70c are dedicated for inspection, so the contact scratches do not influence package reliability.

Figure 12:
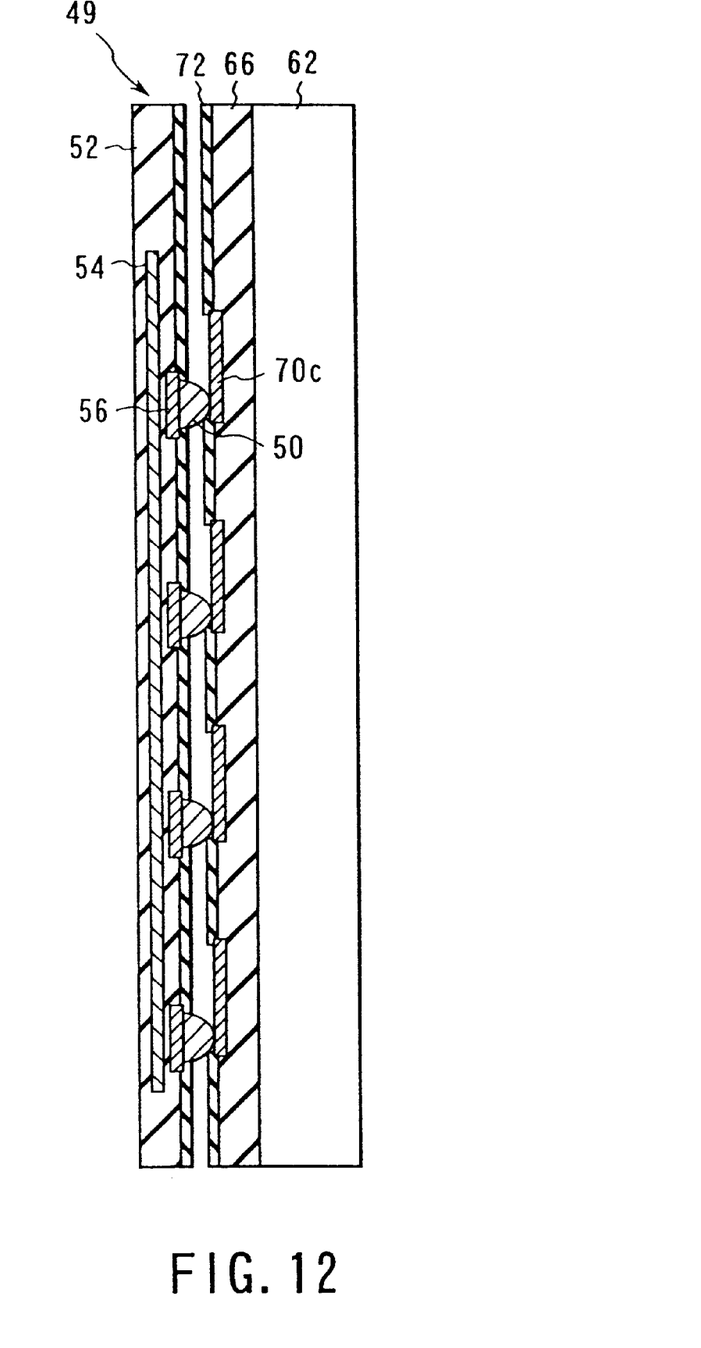
FIG. 12 is a sectional view showing the state in which the membrane probe card is connected to the package according to the third embodiment.

As shown in FIG. 12, measurement may be performed by connecting bumps 50 of a membrane probe card 49 serving as the terminals of the measurement device to the inspection regions 70c before forming the bumps 78 in the bump formation regions 70b of the package. Similar to the above embodiments, the membrane probe card 49 is constituted by forming a ground potential layer 54 and signal wiring layers 56 in a polyimide film 52 so as to face each other, and adjusting the loads of the signal wiring layers 56 to a predetermined impedance.

The measurement using the membrane probe card also forms contact scratches in the inspection regions 70c, but the contact scratches do not influence package reliability. Further, since the loads of the signal wiring layers 56 can be adjusted to a predetermined impedance in the membrane probe card, the impedance is not matched at only the bumps 50 of the membrane probe card 49. However, the bumps 50 are as short as several ten $\mu$m, the impedance is substantially matched, and original package characteristics can be measured.

In the package of the third embodiment, the membrane probe card 49 is connected not to the regions where the external connection bumps 78 are formed, but to the inspection regions 70c. Thus, the regions where the bumps 78 are formed in the rectangular regions are not damaged. Consequently, package reliability is not degraded by, e.g., deterioration of tight contact between the bump formation regions 70b and bumps 78.

The measurement method using the membrane probe card can shorten the wiring portion at which the impedance is not matched in the wiring pattern for connecting the measurement device and package, and can set a load almost equal to that of a package as a final product. Accordingly, the characteristics of the package as a final product can be measured. That is, since the impedance is matched up to the vicinity of the connected portion in the measurement method using the membrane probe card, the package can be evaluated in almost the same environment as in mounting. Furthermore, the final characteristics of the package can be accurately evaluated by bringing, in measurement, the terminals of the measurement device into contact with prospective regions for the bump formation regions 70b where the bumps 78 are to be formed.

At this time, when, e.g., the output timing of the device is found to be slower than the clock signal TCLK owing to process variations as a result of measuring package characteristics, the fuses 96-1 to 96-n are selectively disconnected in accordance with the result. The delay time of the internal clock signal CLK in the delay circuit 86 can be adjusted to set a proper clock signal TCLK. As a result, characteristics in mounting the package can be improved.

Note that the inspection step after bump formation can be omitted if screening of non-defectives and measurement of various characteristics are practiced before bump formation, as described above. This can reduce damage such as contact scratches to the bumps 78 in the inspection step.

A package manufactured by adhering a wafer-like interposer equal in diameter to a wafer, connecting wires, and sealing a resin can be inspected using a general wafer evaluation method and measurement device. This package can attain high inspection throughput, and device characteristics as a final product can be measured.

Even when the inspection step is practiced after bump formation, damage to the formed bumps 78 can be reduced by using the inspection regions 70c dedicated for measurement.

As described above, the third embodiment can easily measure the device characteristics of a package without damaging regions on which external connection bumps are to be formed, and degrading package reliability. Since characteristics can be adjusted by the redundancy circuit in accordance with the results of measuring the final characteristics of the package, the throughput of the package can be improved.

Note that the third embodiment has exemplified a center pad device in which pads serving as semiconductor circuit terminals are arranged near the center of a chip. However, the present invention is not limited to this, and can also be applied to a device in which pads are arranged near the periphery of a chip. The above-mentioned redundancy circuit may be added to the first embodiment. The added redundancy circuit can adjust characteristics in accordance with measurement results, thereby improving the throughput of the package of the first embodiment.

Each of the first to third embodiments uses an organic substrate called an interposer. The organic substrate is made of, e.g., a polyimide resin, epoxy resin, or BT resin. The organic substrate is used because the expansion coefficient of the organic substrate is close to the expansion coefficient of the printed wiring board (PCB) for mounting the package, and no problem arises from the difference between these expansion coefficients. The organic substrate is made of an organic material, similar to the PCB, and exhibits only a small difference in expansion coefficient. Especially the polyimide resin is used for the interlevel insulating film in the chip, too, and has good compatibility with the chip. The polyimide resin is an organic material, similar to the PCB, and exhibits only a small difference in expansion coefficient. In addition, the organic substrate is lower in cost than an inorganic substrate (ceramic substrate or the like).

Note that the inorganic substrate can be easily processed into a multilayered substrate. However, the interposer is made up of a smaller number of layers, so the inorganic substrate need not be used. A problem arising from the difference in expansion coefficient between the chip and PCB is solved by reducing the difference by a chip mount member.

As has been described above, the present invention can provide a semiconductor device which has an outer shape almost equal in size to a chip, has external connection terminals formed in a two-dimensional area, and can measure the device characteristics of a package without damaging a region where an external connection bump is to be formed, or degrading package reliability.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor chip on which a semiconductor circuit is formed;
   a first bonding pad formed on a surface of the semiconductor chip;
   a first insulating substrate formed on the semiconductor chip;
   a wiring layer formed on the first insulating substrate;
   a wire for electrically connecting the wiring layer and the first bonding pad;
   a second insulating substrate formed on the wiring layer;
   a first region where an opening is formed in the second insulating substrate to expose part of a surface of the wiring layer; and
   a second region where an opening is formed in the second insulating substrate to expose part of the surface of the wiring layer, the second region having a rectangular region of at least 25 $\mu$m·25 $\mu$m, the second region allowing contact of a terminal of a measurement device in operation measurement.

2. A device according to claim 1, further comprising:
   a second bonding pad which is formed on the semiconductor chip and connected to a reference voltage level;
   a first wiring pattern connected to the second bonding pad by a wire;
   a redundancy circuit formed on the semiconductor chip;
   a third bonding pad connected to an input node of the redundancy circuit;
   a second wiring pattern connected to the third bonding pad by a wire; and
   fuse wiring formed between the first and second wiring patterns to set the first and second wiring patterns to either one of connection and disconnection states.

3. A device according to claim 2, wherein the fuse wiring is formed from part of the wiring pattern thinner than a remaining part, from which the second insulating substrate is removed.

4. A device according to claim 2, wherein the device further comprises signal generation circuits formed on the semiconductor chip, and the signal generation circuits receive an output signal from the redundancy circuit and adjust timings of signals to be output in accordance with the output signal.

5. A semiconductor device comprising:
   a semiconductor chip on which a semiconductor circuit is formed;
   a first bonding pad formed on a surface of the semiconductor chip;
   a first insulating substrate formed on the semiconductor chip;
   a wiring layer formed on the first insulating substrate;
   a wire for electrically connecting the wiring layer and the first bonding pad;
   a second insulating substrate formed on the wiring layer; and
   a region where an opening is formed in the second insulating substrate to expose part of a surface of the wiring layer, the region having a first region where a bump is formed, and a second region where no bump is formed, the second region having a rectangular region of at least 25 $\mu$m·25 $\mu$m, the second region allowing contact of a terminal of a measurement device in operation measurement.

6. A device according to claim 5, further comprising:
   a second bonding pad which is formed on the semiconductor chip and connected to a reference voltage level;
   a first wiring pattern connected to the second bonding pad by a wire;
   a redundancy circuit formed on the semiconductor chip;
   a third bonding pad connected to an input node of the redundancy circuit;
   a second wiring pattern connected to the third bonding pad by a wire; and
   fuse wiring formed between the first and second wiring patterns to set the first and second wiring patterns to either one of connection and disconnection states.

7. A device according to claim 6, wherein the fuse wiring is formed from part of the wiring pattern thinner than a remaining part, from which the second insulating substrate is removed.

8. A device according to claim 6, wherein the device further comprises signal generation circuits formed on the semiconductor chip, and the signal generation circuits receive an output signal from the redundancy circuit and adjust timings of signals to be output in accordance with the output signal.

9. A semiconductor device comprising:
   a semiconductor chip on which a semiconductor circuit is formed;
   a first bonding pad formed on a surface of the semiconductor chip;
   a first insulating substrate formed on the semiconductor chip in which an opening is formed to expose part of a surface of the semiconductor chip including the first bonding pad;
   a wiring layer formed on the first insulating substrate;
   a wire for electrically connecting the wiring layer and the first bonding pad;
   a second insulating substrate formed on the wiring layer;
   an insulating resin formed to cover the wire and the surface of the semiconductor chip including the first bonding pad that is exposed in the opening of the first insulating substrate; and
   a region of the wiring layer where an opening is formed in the second insulating substrate to expose part of the surface of the wiring layer, the region having a first region where a bump is formed, and a second region where no bump is formed, the second region having a rectangular region of at least 25 $\mu$m·25 $\mu$m, the second region allowing contact of a terminal of a measurement device in operation measurement.

10. A device according to claim 9, further comprising:
    a second bonding pad which is formed on the semiconductor chip and connected to a reference voltage level;
    a first wiring pattern connected to the second bonding pad by a wire;
    a redundancy circuit formed on the semiconductor chip;
    a third bonding pad connected to an input node of the redundancy circuit;
    a second wiring pattern connected to the third bonding pad by a wire; and
    fuse wiring formed between the first and second wiring patterns to set the first and second wiring patterns to either one of connection and disconnection states.

11. A device according to claim 10, wherein the fuse wiring is formed from part of the wiring pattern thinner than a remaining part, from which the second insulating substrate is removed.

12. A device according to claim 10, wherein the device further comprises signal generation circuits formed on the semiconductor chip, and the signal generation circuits receive an output signal from the redundancy circuit and adjust timings of signals to be output in accordance with the output signal.

13. A semiconductor device comprising:
    a semiconductor chip on which a semiconductor circuit is formed;
    a first insulating substrate formed on the semiconductor chip;
    a wiring layer which is formed on the first insulating substrate and electrically connected to the semiconductor circuit;
    a second insulating substrate formed on the wiring layer;
    a first region where an opening is formed in the second insulating substrate to expose part of a surface of the wiring layer; and
    a second region where an opening is formed in the second insulating substrate to expose part of the surface of the wiring layer, the second region having a rectangular region of at least 25 $\mu$m·25 $\mu$m, the second region allowing contact of a terminal of a measurement device in operation measurement.

14. A device according to claim 13, further comprising:
    a first wiring pattern which is formed on the first insulating substrate and electrically connected to part of the semiconductor circuit to which a reference voltage level is applied;
    a redundancy circuit formed on the semiconductor chip;
    a second wiring pattern which is formed on the first insulating substrate and electrically connected to an input node of the redundancy circuit; and
    fuse wiring formed between the first and second wiring patterns to set the first and second wiring patterns to either one of connection and disconnection states.

15. A device according to claim 14, wherein the fuse wiring is formed from part of the wiring pattern thinner than a remaining part, from which the second insulating substrate is removed.

16. A device according to claim 14, wherein the device further comprises signal generation circuits formed on the semiconductor chip, and the signal generation circuits receive an output signal from the redundancy circuit and adjust timings of signals to be output in accordance with the output signal.

17. A semiconductor device comprising:
    a semiconductor chip on which a semiconductor circuit is formed;
    a first insulating substrate formed on the semiconductor chip;
    a wiring layer which is formed on the first insulating substrate and electrically connected to the semiconductor circuit;
    a second insulating substrate formed on the wiring layer; and
    a region where an opening is formed in the second insulating substrate to expose part of a surface of the wiring layer; the region having a first region where a bump is formed, and a second region where no bump is formed, the second region having a rectangular region of at least 25 $\mu$m·25 $\mu$m, the second region allowing contact of a terminal of a measurement device in operation measurement.

18. A device according to claim 17, further comprising:
    a first wiring pattern which is formed on the first insulating substrate and electrically connected to part of the semiconductor circuit to which a reference voltage level is applied;
    a redundancy circuit formed on the semiconductor chip;
    a second wiring pattern which is formed on the first insulating substrate and electrically connected to an input node of the redundancy circuit; and
    fuse wiring formed between the first and second wiring patterns to set the first and second wiring patterns to either one of connection and disconnection states.

19. A device according to claim 18, wherein the fuse wiring is formed from part of the wiring pattern thinner than a remaining part, from which the second insulating substrate is removed.

20. A device according to claim 18, wherein the device further comprises signal generation circuits formed on the semiconductor chip, and the signal generation circuits receive an output signal from the redundancy circuit and adjust timings of signals to be output in accordance with the output signal.

21. A semiconductor device comprising:
   a semiconductor chip on which a semiconductor circuit is formed;
   a first bonding pad formed on a surface of the semiconductor chip;
   a first insulating substrate formed on the semiconductor chip;
   a wiring layer formed on the first insulating substrate;
   a wire for electrically connecting the wiring layer and the first bonding pad;
   a second insulating substrate formed on the wiring layer;
   a first region where a first opening is formed in the second insulating substrate to expose part of a surface of the wiring layer; and
   a second region where a second opening is formed in the second insulating substrate to expose part of the surface of the wiring layer, the second opening is separated from the first opening by the second insulating substrate, the second region allowing contact of a terminal of a measurement device in operation measurement.

22. The semiconductor device according to claim 21, wherein the second region has a rectangular region of at least 25 $\mu$m·25 $\mu$m.

23. The semiconductor device according to claim 21, further comprising:
   a second bonding pad which is formed on the semiconductor chip and connected to a reference voltage level;
   a first wiring pattern connected to the second bonding pad by a wire;
   a redundancy circuit formed on the semiconductor chip;
   a third bonding pad connected to an input node of the redundancy circuit;
   a second wiring pattern connected to the third bonding pad by a wire; and
   fuse wiring formed between the first and second wiring patterns to set the first and second patterns to either one of connection and disconnection states.

24. The semiconductor device according to claim 23, wherein the fuse wiring is formed from part of the wiring pattern thinner than a remaining part, from which the second insulating substrate is removed.

25. The semiconductor device according to claim 23, further comprising signal generation circuits formed on the semiconductor chip, the signal generation circuits receiving an output signal from the redundancy circuit and adjusting timing of signals to be output in accordance with the output signal.

26. A semiconductor device comprising:
   a semiconductor chip on which a semiconductor circuit is formed;
   a first insulating substrate formed on the semiconductor chip;
   a wiring layer which is formed on the first insulating substrate and electrically connected to the semiconductor circuit;
   a second insulating substrate formed on the wiring layer;
   a first region where a first opening is formed in the second insulating substrate to expose part of a surface of the wiring layer; and
   a second region where a second opening is formed in the second insulating substrate to expose part of the surface of the wiring layer, the second opening is separated from the first opening by the second insulating substrate, the second region allowing contact of a terminal of a measurement device in operation measurement.

27. The semiconductor device according to claim 26, wherein the second region has a rectangular region of at least 25 $\mu$m·25 $\mu$m.

28. The semiconductor device according to claim 26, further comprising:
   a first wiring pattern which is formed on the first insulating substrate and electrically connected to part of the semiconductor circuit to which a reference voltage level is applied;
   a redundancy circuit formed on the semiconductor chip;
   a second wiring pattern which is formed on the first insulating substrate and electrically connected to an input node of the redundancy circuit; and
   fuse wiring formed between the first and second wiring patterns to set the first and second patterns to either one of connection and disconnection states.

29. The semiconductor device according to claim 28, wherein the fuse wiring is formed from part of the wiring pattern thinner than a remaining part, from which the second insulating substrate is removed.

30. The semiconductor device according to claim 28, further comprising signal generation circuits formed on the semiconductor chip, the signal generation circuits receiving an output signal from the redundancy circuit and adjusting timing of signals to be output in accordance with the output signal.

* * * * *